(12) United States Patent
Matero

(10) Patent No.: US 7,522,676 B2
(45) Date of Patent: Apr. 21, 2009

(54) METHOD AND SYSTEM FOR TRANSMITTER ENVELOPE DELAY CALIBRATION

(75) Inventor: Jorma Matero, Oulu (FI)

(73) Assignee: Nokia Corporation, Espoo (FI)

( * ) Notice: Subject to any disclaimer, the term of this patent is extended or adjusted under 35 U.S.C. 154(b) by 619 days.

(21) Appl. No.: 11/349,555

(22) Filed: Feb. 6, 2006

(65) Prior Publication Data

US 2007/0183532 A1 Aug. 9, 2007

(51) Int. Cl.
*H04L 27/00* (2006.01)

(52) U.S. Cl. .................................... 375/295; 375/219

(58) Field of Classification Search .............. 375/295, 375/219, 297, 298, 301, 316, 337, 358
See application file for complete search history.

(56) References Cited

U.S. PATENT DOCUMENTS

| | | | |
|---|---|---|---|
| 6,032,028 A | * | 2/2000 | Dickey et al. ............... 455/110 |
| 6,353,628 B1 | * | 3/2002 | Wallace et al. .............. 375/220 |
| 6,909,757 B2 | | 6/2005 | Justice et al. ............... 375/297 |
| 2005/0069026 A1 | | 3/2005 | Vepsalainen et al. ........ 375/219 |

* cited by examiner

*Primary Examiner*—Emmanuel Bayard
(74) *Attorney, Agent, or Firm*—Ware, Fressola,Van Der, Sluys & Adolphson, LLP

(57) ABSTRACT

A test signal comprising a periodic waveform, such as a triangular waveform and sawtooth waveform, is used for propagation delay matching in a transceiver front-end. The test signal is separately fed to the envelope path and the RF path. At the power amplifier stage, a phase modulator is used to obtain the envelope signal and the phase modulated RF signal for demodulation by an IQ demodulator. At the output end of the IQ demodulator, the I-signal is measured while the delay block is adjusted in order to vary the propagation delay. When the propagation delay matching is correct, the peak-to-peak value of the I-signal is a minimum. Preferably, during calibration using the test signal, the transmitter RF power amplifier is disabled so that no spurious signals will be sent. The transmitter can be an EDGE polar transmitter, a non-EDGE transmitter or a EER polar transmitter.

20 Claims, 9 Drawing Sheets

METHOD AND SYSTEM FOR TRANSMITTER ENVELOPE DELAY CALIBRATION

FIELD OF THE INVENTION

The present invention relates generally to a RF transmitter and, more particularly, to adjusting the path delay difference between the envelope path and the RF path in a polar transmitter.

BACKGROUND OF THE INVENTION

Conventionally, a direct upconversion transmitter has at least an I/Q modulator, an RF mixer, a filter and a power amplifier. The I/Q modulator is an efficient way to generate phase-modulated signals. It relies on two orthogonal signals, I (in-phase) and Q (quadrature), to produce a single complex waveform. In a direct upconversion transmitter, the I/Q modulator transforms the frequency spectrum of each orthogonal input signal to the RF carrier frequency. As such, two digital-to-analog (D/A) converters are needed to transform a digital baseband into an analog baseband.

In recent years, other forms of transmitters have received attention from the RF R&D community: transmitters that use high efficiency, non-linear power amplifiers, including Class-C, D, E, F or saturated Class-B, in order to reduce transmitter power consumption. These non-linear power amplifiers, however, cannot pass amplitude modulation without spectral re-growth. Thus, the input RF signal can only have phase modulation. The amplitude modulation must be introduced separately in a PA power supply.

Due to the separation of amplitude and phase, these types of transmitter architecture are generically called Polar transmitters, as opposed to Cartesian transmitters which use I and Q baseband signals directly. In a digital polar transmitter, modulation signal is divided into a phase modulation (PM) component and an amplitude modulation (AM) component. The PM component can be amplified with a high efficiency, non-linear transmitter chain whereas the amplitude envelope signal (AM) is applied to the RF power amplifier. Because the PM signal and the AM signal are conveyed to different modulation paths, it is important to have substantially the same propagation delay in both modulation paths. A delay mismatch increases adjacent channel power (ACP). A typical EDGE (Enhanced Data rate for GSM Evolution) polar transmitter is shown in FIG. 1a. As shown, an EDGE modulation module is used to provide the I and Q digital baseband data as modulated by 8PSK (8-phase shift keying) to an IQ to Polar converter, where the EDGE modulation signal is separated into an AM component and a PM component. The AM component is conveyed in an envelope path, which comprises a digital-to-analog converter (DAC), a switch-mode power supply (SMPS) and a low-pass (LP) filter. In the envelope path, the AM data becomes an envelope signal in a form of the voltage supply to the linear power amplifier (PA). SMPS, in this application, acts as a high efficiency amplifier for the envelope signal. The PM component is conveyed in the phase component path, which comprises a PM-to-FM block, and a PLL+FM block. Because the envelope path has longer propagation delay mainly due to the switch-mode power supply, a delay block in the phase component path is used to make up the difference between the propagation delay between the two paths.

In a non-EDGE polar transmitter as shown in FIG. 1b, the I and Q digital baseband signals are converted to the amplitude and phase components in a Cartesian to Polar converter. A different polar transmitter is based on the envelope elimination and restoration (EER) principle. In an EER polar transmitter as shown in FIG. 1c, the RF signal is introduced by the IQ modulator and the envelope of the RF signal is detected and fed forward to the envelope path which comprises an envelope detector, a pulse-width modulator (PWM) and an amplifier A3. The PM-only signal is obtained from a limiter A1 before it is amplified by a power amplifier A2.

In digital polar transmitter, such as an EGDE polar transmitter, it is important to match the propagation delay in the envelope path to that in the phase component path. For EDGE this matching requirement is Ts/128=28.8 ns, where Ts is the modulation symbol time. As mentioned above, a delay mismatch increases the adjacent channel power. In prior art, it has been proposed to use the adjacent channel power measurement as a way to find the right delay compensation value.

The present invention provides a new method and system for carrying out the calibration for the propagation delay matching.

SUMMARY OF THE INVENTION

The present invention uses a test signal comprising a periodic waveform, such as a triangular waveform or sawtooth waveform, for propagation delay matching in a transceiver front-end. The same test signal is separately fed to the envelope path and the phase modulation path. At the power amplifier stage, the envelope signal and the phase modulated RF signal are obtained so that they can be conveyed to an IQ demodulator via a phase modulator. The IQ demodulator normally exists at the receive section of the transceiver front-end. At the output end of the IQ demodulator, the I-signal is measured while the delay block is adjusted in order to vary the propagation delay. When the propagation delay matching is correct, the peak-to-peak value of the I-signal is a minimum. Preferably, during calibration using the test signal, the transmitter RF power amplifier is disabled so that no spurious signals will be sent.

The delay adjustment system and method, according to the present invention, can be applied to an EDGE polar transmitter, a non-EDGE transmitter or a polar transmitter that is based on the envelope elimination and restoration principle.

The present invention will become apparent upon reading the description taken in conjunction with FIGS. 2 to 8.

DETAILED DESCRIPTION OF THE INVENTION

Figure 1A:
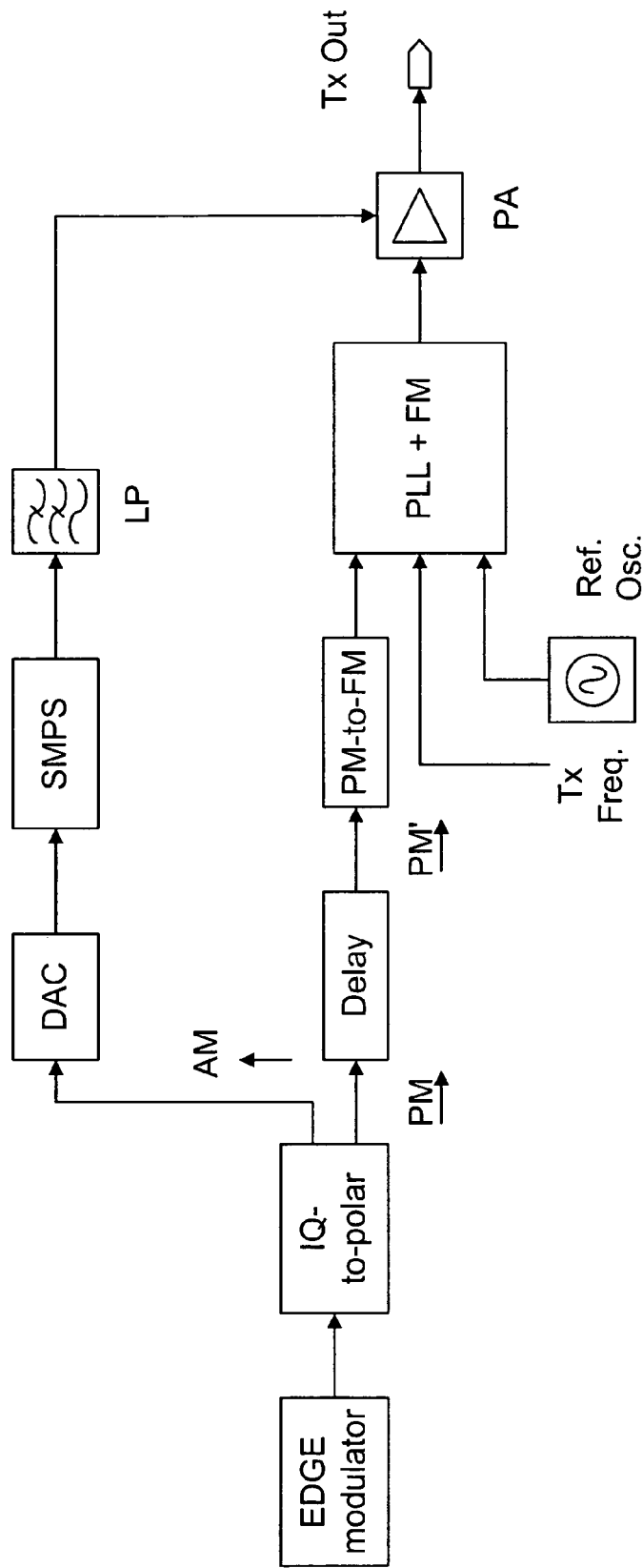
FIG. 1a shows a prior art EDGE polar transmitter.

As shown in FIG. 1a, a delay block is disposed in the phase component path to compensate for the longer propagation delay in the envelope path. The present invention provides a method and system to determine the accurate delay compensation value for the delay block. An exemplary system for determining the delay compensation value for the delay block is shown in FIG. 2.

Figure 2:
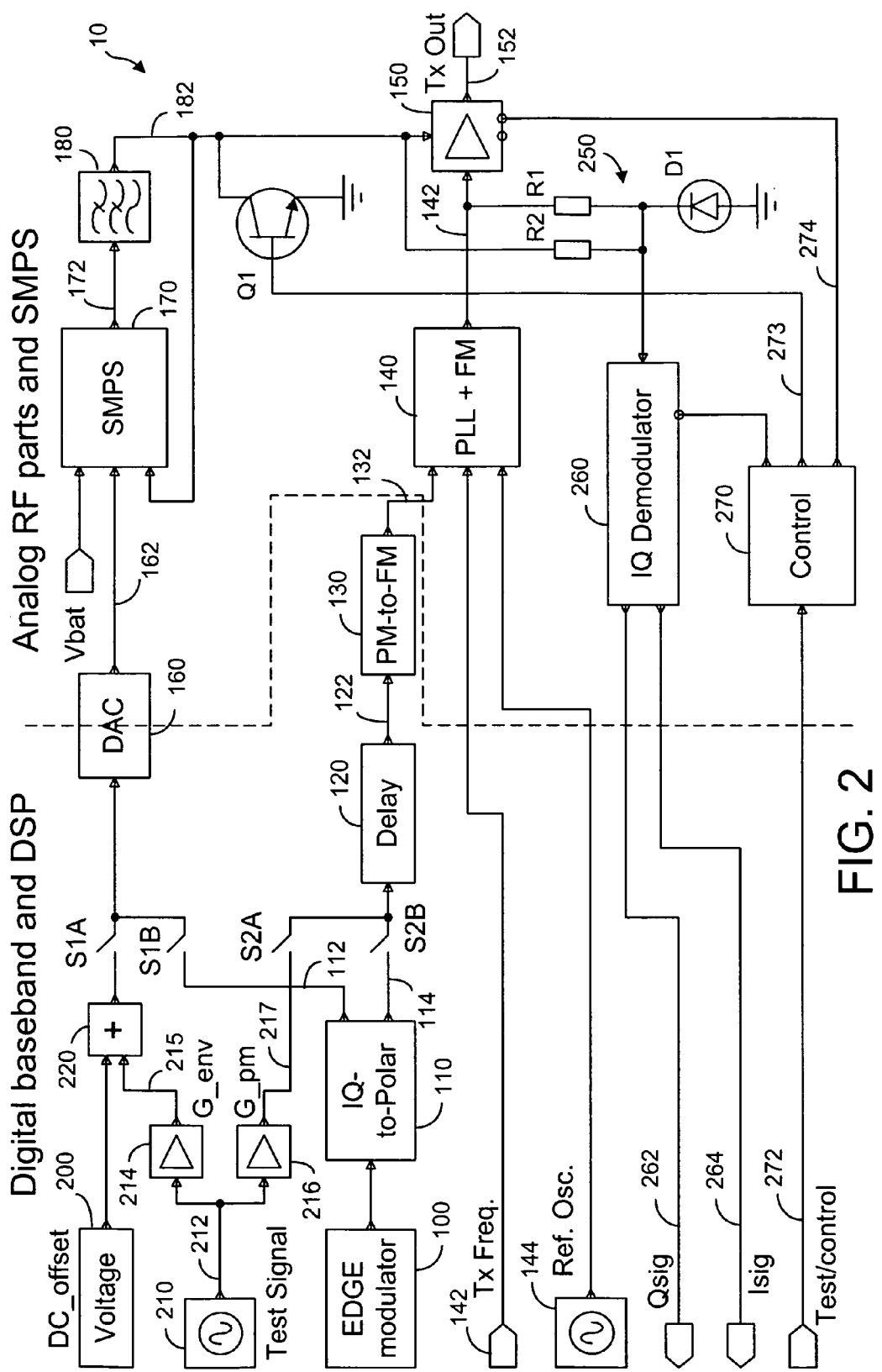
FIG. 2 is a simplified block diagram showing the system for the AM/PM propagation delay calibration in an EDGE polar transmitter, according to one embodiment of the present invention.

As shown in FIG. 2, an EDGE modulation module 100 is used to provide the I and Q digital baseband data as modulated by 8PSK to an IQ-to-Polar converter 110, where the EDGE modulation signal is separated into an AM component 112 and a PM component 114. The AM component 112 is conveyed in an envelope path to a digital-to-analog converter (DAC) 160 where the digital AM component is converted to an analog AM component 162. After being converted by a switch-mode power supply (SMPS) 170, the amplified AM component 172 is filtered by a low-pass filter 180 so that an envelope signal 182 indicative of the AM component is conveyed to a non-linear power amplifier (PA) 150 as the voltage supply to the PA. The PM component 114 is conveyed to a delay block 120 for providing a delay PM component 122. A PM-to-FM block 130 is used to change the phase modulation (PM) information into FM information in a signal 132. With references to the transmit frequency 142 and a reference oscillator 144, a phase-lock loop is used as a synthesizer 140 so that the FM information in the signal 132 is modulated to provide a phase-modulated RF signal 142. The phase-modulated RF signal from the output of the frequency synthesizer 140 is further amplitude-modulated by the envelope signal 182 at the non-linear power amplifier 150 for transmission at the transmit port 152.

Figure 5:
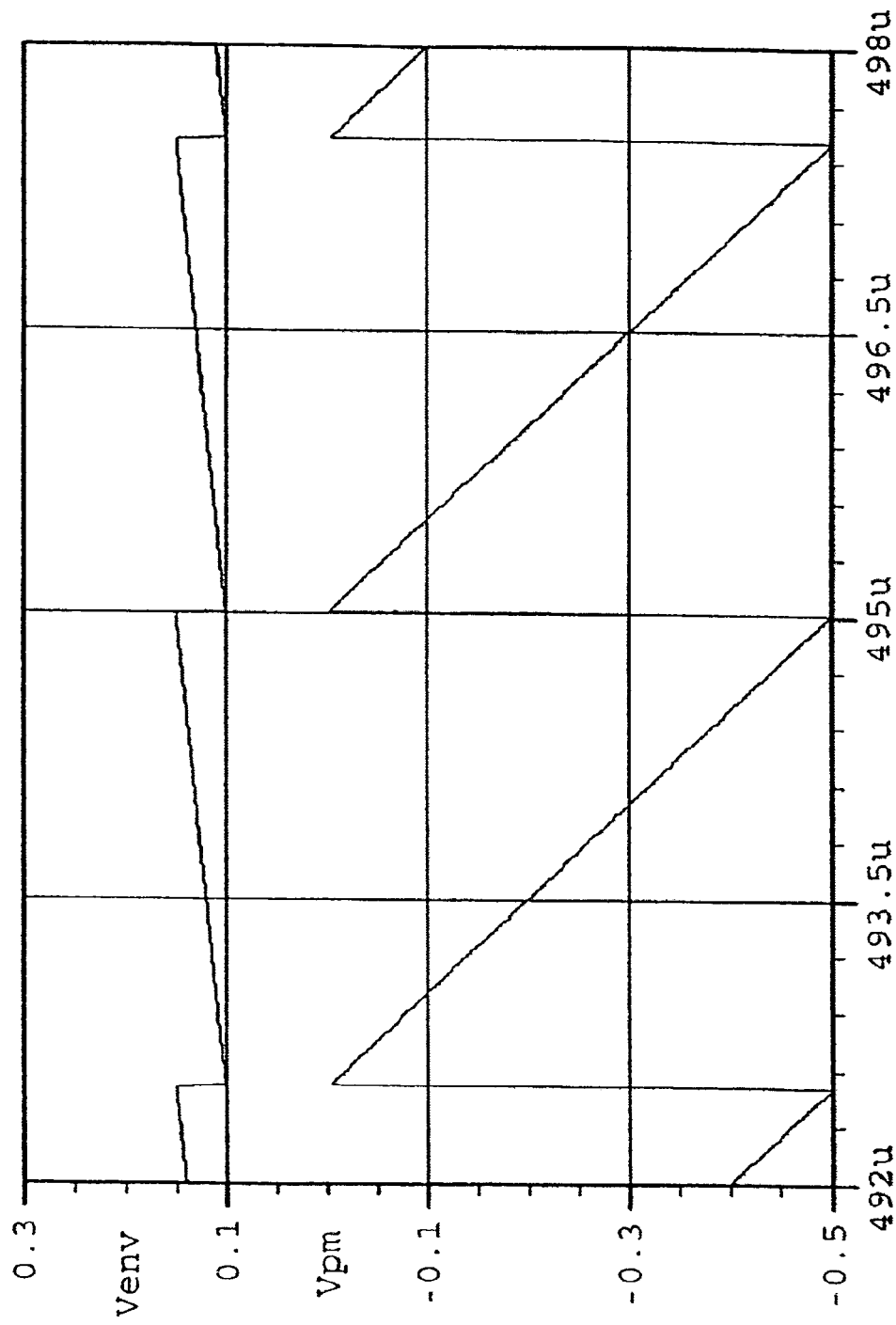
FIG. 5 is an exemplary waveform for use as a test signal for AM/PM propagation delay calibration, according to the present invention.

The transceiver front-end 10, according to one embodiment of the present invention, comprises a set of switches S1A, S1B connected in the envelope path and a set of switches S2A, S2B connected in the PM path. Switch S1B is disposed between DAC 160 and the AM component output of the IQ-to-Polar converter 110. Switch S1A is disposed between DAC 160 and a test signal for the envelope path. The switch S2B is disposed between the delay block 120 and the PM component output of the IQ-to-Polar converter 110. The switch S2A is disposed between the delay block 120 and a test signal for the PM path. The test signal for the envelope path and that for the PM path are generated by a test signal source 210. The test signal 212 generated by the test signal source 210 is a periodic waveform, such as a triangular waveform or a sawtooth waveform. After being adjusted by an amplifier 214, the adjusted waveform 215 is conveyed to a summing device 220 where a voltage source 200 can be used to provide a DC-offset level to the adjusted waveform 215. A separate amplifier 216 is used to adjust the test signal 212 for providing an adjusted waveform 217. An example of the adjusted waveform 215 for the envelope path and the adjusted waveform 217 for the PM path are shown in FIG. 5.

In the normal modulation mode, switches S1B and S2B are closed (ON) so as to allow the AM component 112 and the PM component 114 to be conveyed to DAC 160 and the delay block 120, respectively. At the same time, switches S1A and S2A are open (OFF) so as to keep the test signal from entering into the transceiver front end.

In the calibration mode, switches S1B and S2B are open (OFF) while switches S1A and S2A are closed (ON) so that test signals are separately applied to the envelope and PM paths. Both test signals are derived from a common signal 212. As shown in FIG. 5, a common signal 212 is a 400 kHz sawtooth wave, for example. For the envelope path, the test signal is adjusted such that the signal peak amplitude is set to 0.05V with 0.2V DC offset added. The DC gain of the SMPS 170 is assumed to be substantially equal to 1. Scaling and sign of the test signal for the PM path is made according to frequency synthesizer 140. As shown in FIG. 5, the test signals in the two paths are of opposite signs. During the calibration, the RF power amplifier 150 is disabled by a control signal 274 from a control circuit 270 under a test/control signal 272 so that no spurious signals will be sent. At the same time, the transistor Q1 is biased by a signal 273 from the control circuit 270 so as to sink the current from the output of the SMPS 170. It should be noted that the SMPS 170 has a low-pass filter (LPF) 180 at its output. The frequency response of the SMPS and LPF combination depends on the current from the output. Under normal operation, it is the current drawn by the RF power amplifier 150 that determines the frequency response of the SMPS/LPF combination. In the calibration mode, the transistor Q1 is used to imitate the process because the RF power amplifier 150 is disabled. Thus, it is preferable that the sink current value through the transistor Q1 is substantially equal to the average current used on the RF power amplifier 150 on the power level where delay calibration is desired. Since frequency response affects the group delay, it is essential to have a correct frequency response during the calibration. On the highest power level, the SMPS average current can reach 1 Amp.

In order to determine the correct delay compensation of the delay block 120, a phase modulator 250 is used to create a PM signal versus an envelope signal at the input of an IQ demodulator 260 of the receiver. The principle of propagation delay calibration, according to the present invention, is based on the idea that because both the test PM signal from the output of the frequency synthesizer 140 and the test envelope signal from the output of the low-pass filter 180 are of the same waveform, these test signals at least partially cancel each other when the delay match at the delay block 120 has the right value. The cancellation of the two test signals can be accomplished at the phase modulator 250. For example, the phase modulator can be made of a resistor R1, a resistor R2 and a varactor diode D1. The output RF signal from the frequency synthesizer 140 is coupled to the IQ demodulator 260 via the resistor R1. The varactor diode D1 is coupled between R1 and ground. D1 capacitance depends on voltage, which is fed via the resistor R2. A change in the D1 capacitance causes a change in the RF signal phase. Thus, a phase modulator can be achieved by such an arrangement of R1, R2 and D1.

Figure 6:
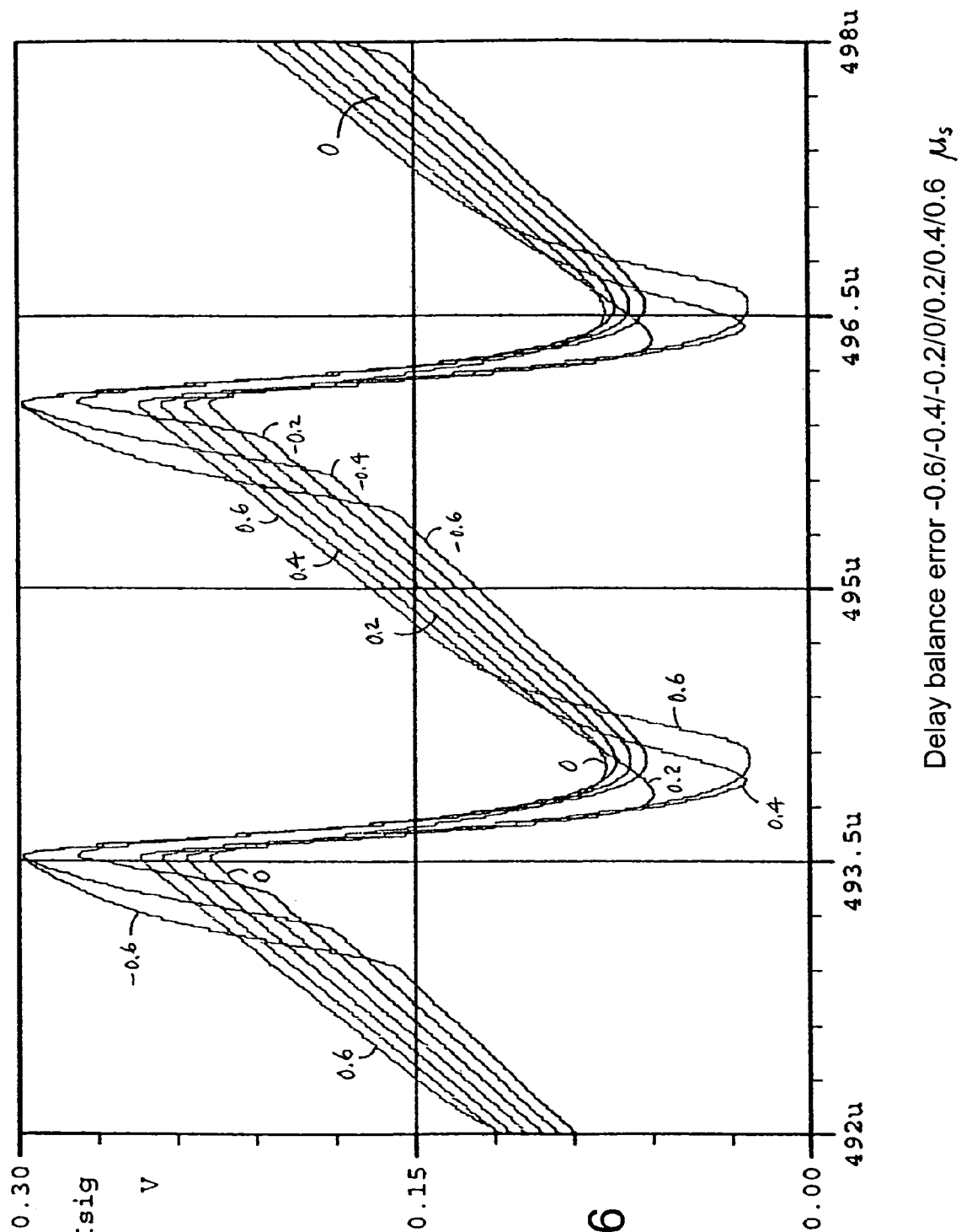
FIG. 6 shows a plot of I-signal waveform against delay balance.

There are two outputs from the IQ demodulator 260: an I-signal 264 and a Q-signal 262. For calibration purposes, only the I-signal 264 is measured. A plot of I-signal versus delay balance is shown in FIG. 6.

Figure 7:
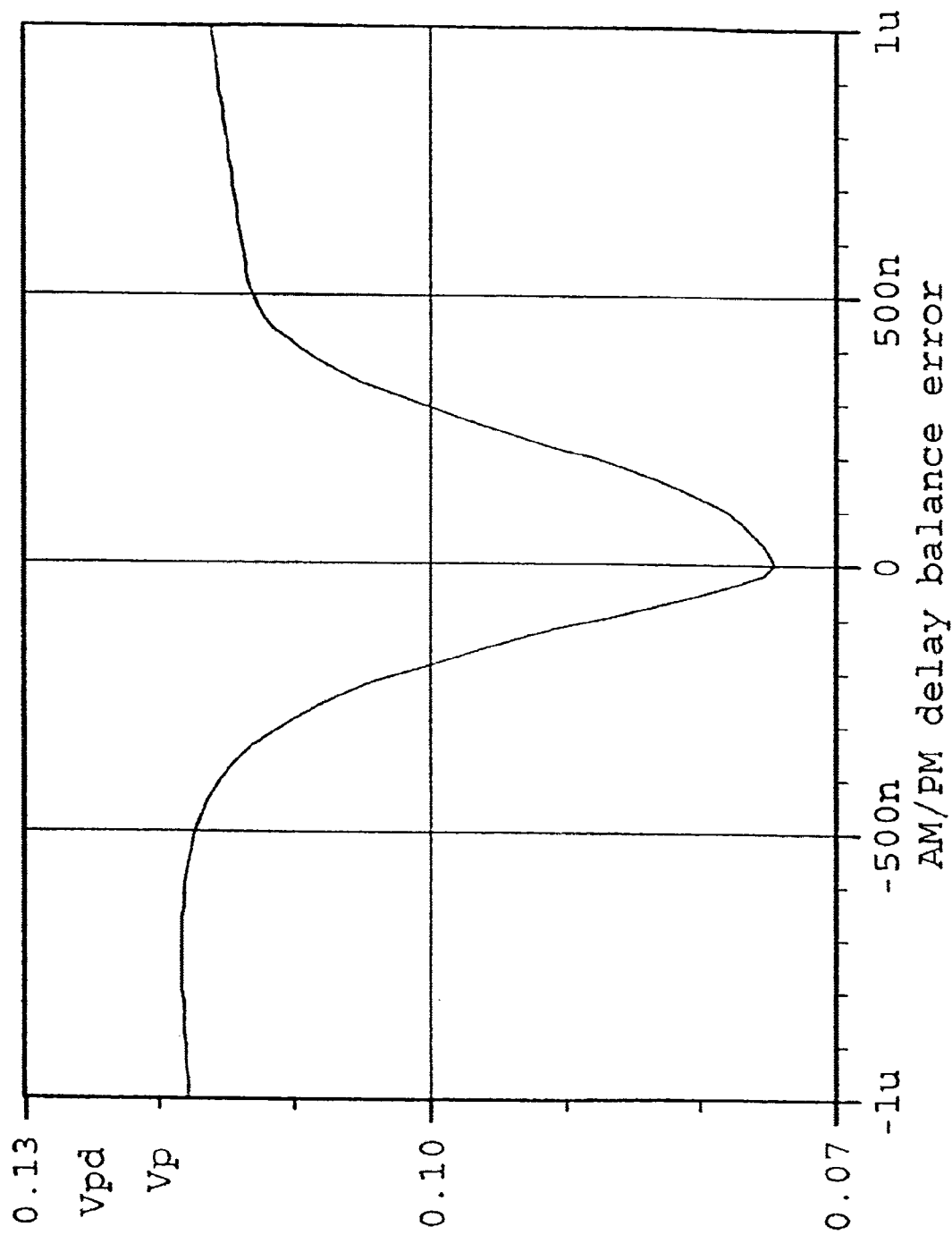
FIG. 7 shows a plot of I-signal peak-to-peak amplitude against delay balance.

As shown, when the delay balance is equal to 0, the peak-to-peak amplitude of the I-signal is smallest. A plot of I-signal peak-to-peak amplitude versus delay balance is shown in FIG. 7. In FIGS. 5 to 7, the test signals are of a 400 kHz sawtooth waveform.

Thus, according to the present invention, a delay PM test signal is conveyed to a PM-to-FM block 130 and the synthesizer 140 so that the synthesizer 140 provides a phase-modulated RF signal 142 indicative of the PM test signal. The phase-modulated RF signal 142 is phase-modulated a second time in the phase modulator 250. When there is a delay match, the sum of these operations produces a minimum in the cascaded PM.

The deviation of the cascaded PM signal is measured by the receive front end coupled to the output of the phase modulator 250. The receive front end is shown as an IQ demodulator 260. Only the I-signal peak-to-peak amplitude has to be monitored to find out the delay match. Delay in the delay block 120 is adjusted until the minimum peak-to-peak I-signal value is achieved. Finally, the right delay value is stored in a mobile terminal that uses an equivalent EGDE polar transmitter. For the delay calibration at a higher transmit output power level, the same procedure with a higher envelope test signal is used.

Figure 3:
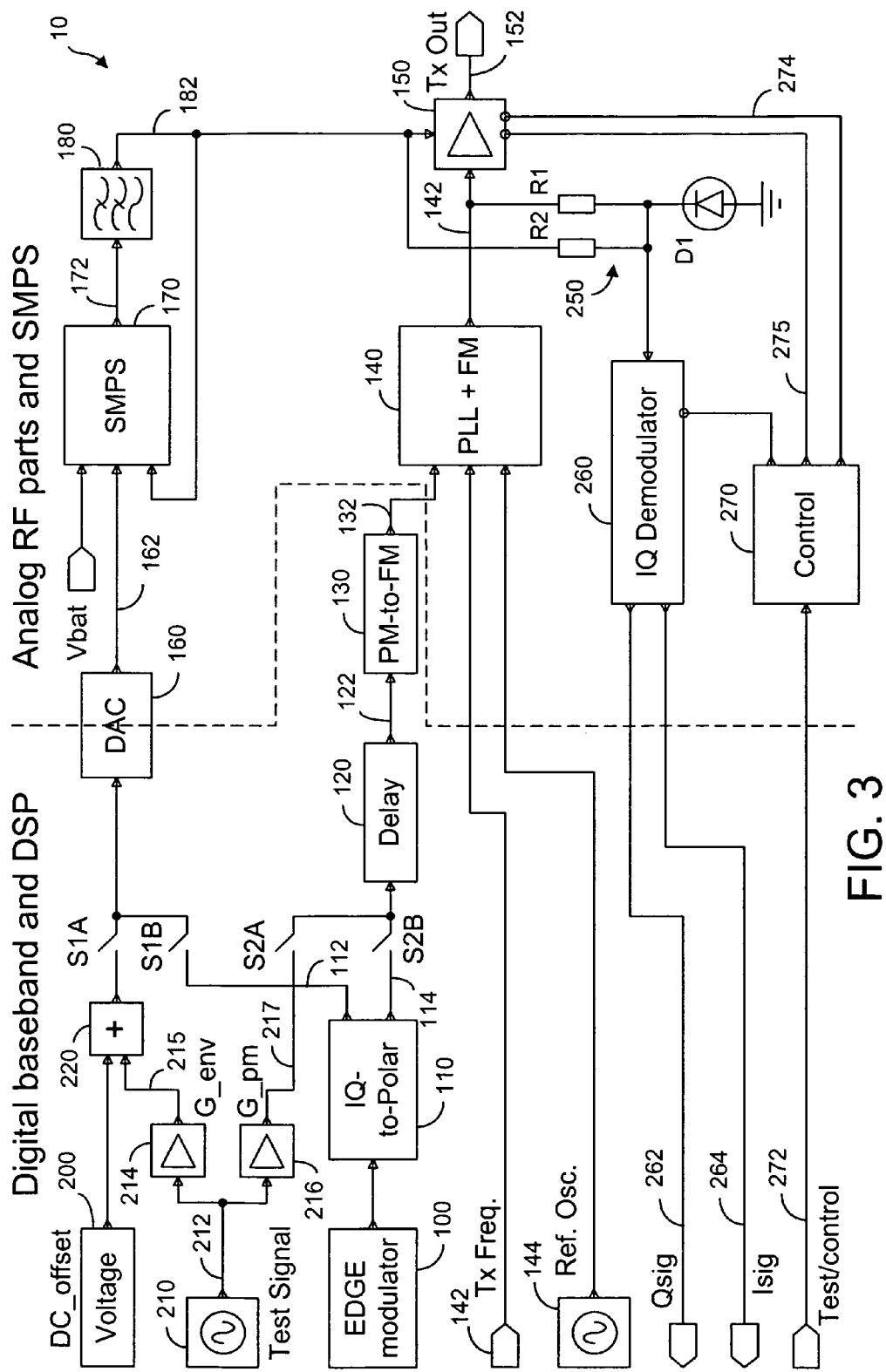
FIG. 3 is a simplified block diagram showing the system for the AM/PM propagation delay calibration in an EDGE polar transmitter, according to another embodiment of the present invention.

Another embodiment of the present invention is shown in FIG. 3. In this embodiment, the control circuit 270 biases the last RF PA transistor (not shown) in the non-linear power amplifier 150 with a control signal 275 so that the last RF PA transistor acts like an active load. As such, no separate active load transistor Q1 is required.

Figure 4:
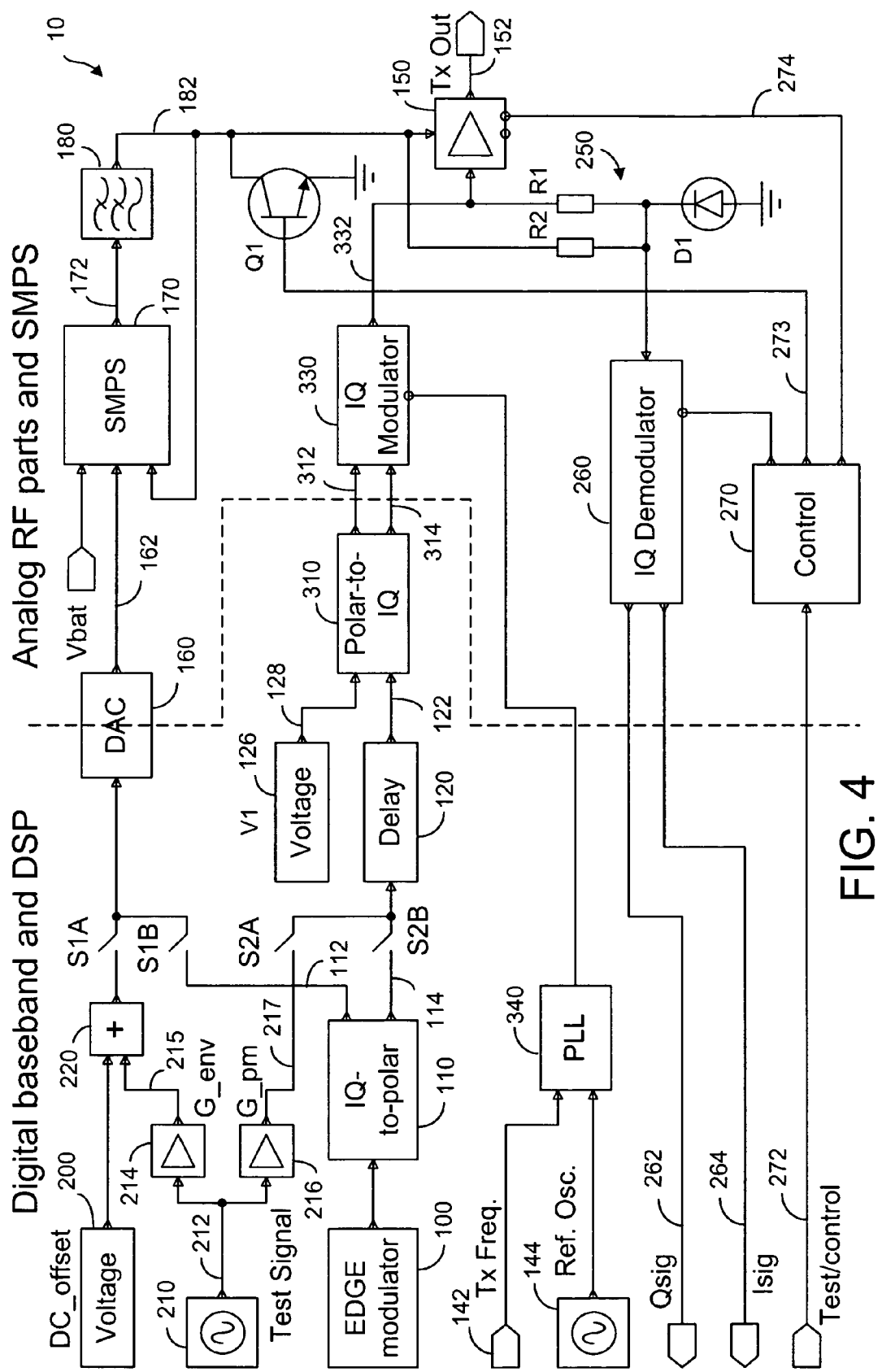
FIG. 4 is a simplified block diagram showing the system for the AM/PM propagation delay calibration in an EDGE polar transmitter, according to yet another embodiment of the present invention.

It should be noted that, in the polar transmitter as shown in FIGS. 2 and 3, phase modulation (after conversion to FM by the PM-to-FM block 130) is applied to a frequency synthesizer 140. However, an IQ modulator can also be used to generate the phase-modulated RF signal instead of the frequency synthesizer. As shown in FIG. 4, the delayed PM component 122 is fed to the phase angle of a Polar-to-IQ converter 310. Because PM signal has a constant envelope, it is possible to apply a constant voltage 128 from a voltage source 126 to the envelope input of the Polar-to-IQ converter 310. The converted I and Q data 312, 314 are conveyed to the IQ modulator 330 and the output 332 of the IQ modulator 330 is coupled to the phase modulator 250. The transmit frequency is provided by the synthesizer 340.

Figure 1B:
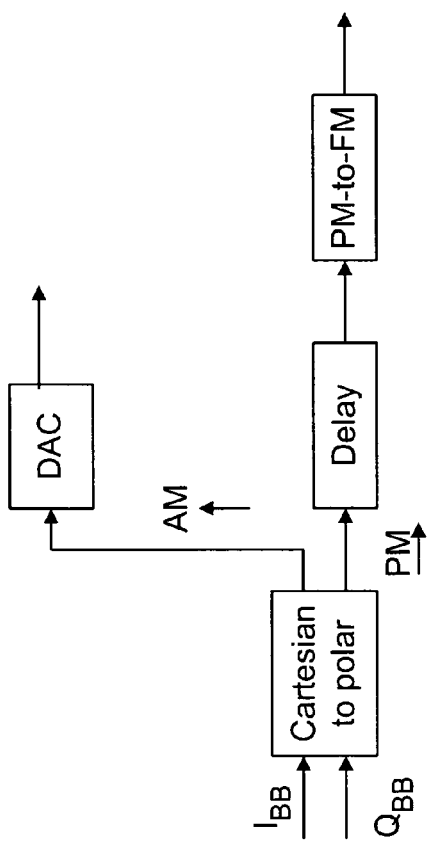
FIG. 1b shows a polar transmitter with I and Q baseband data input.
Figure 1C:
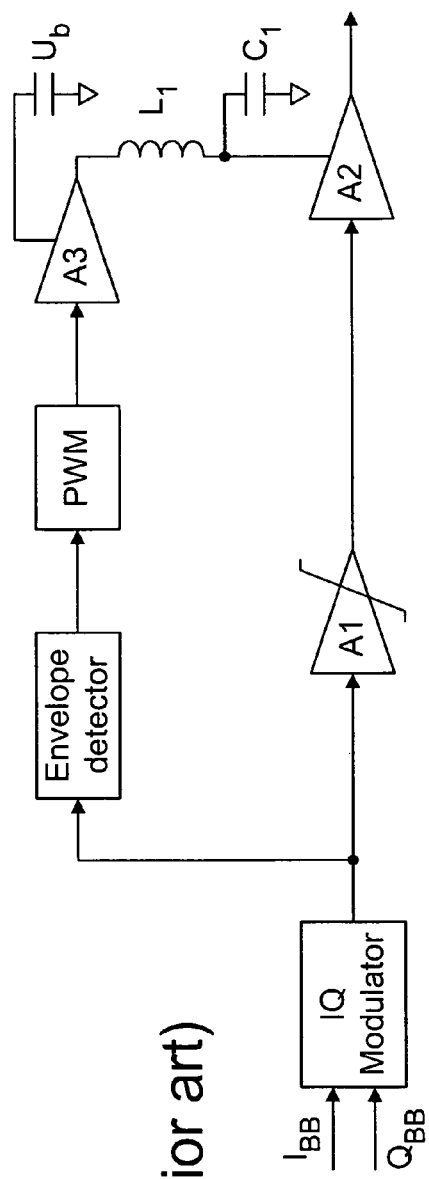
FIG. 1c shows an EER polar transmitter.

The present invention has been disclosed in a number of embodiments related to an EDGE polar transmitter. FIGS. 2 to 4 are used to illustrate the principle of delay calibration, according to the present invention. However, the same principle is also applicable to a non-EDGE polar transmitter, such as that illustrated in FIG. 1b. The delay calibration principle, according to the present invention, is also applicable to an envelope tracking transmitter, as shown in FIG. 8.

It should be noted that an envelope tracking transmitter is a linear transmitter, where the supply voltage to the RF power amplifier (PA) 450 is adjusted by the RF output signal envelope. This improves the PA efficiency. The input signal to the PA is the normal modulated RF signal containing both amplitude and phase modulation components. It is important to have equal propagation delay between the PA input RF signal 332 and the envelope component 482 of the supply voltage.

Figure 8:
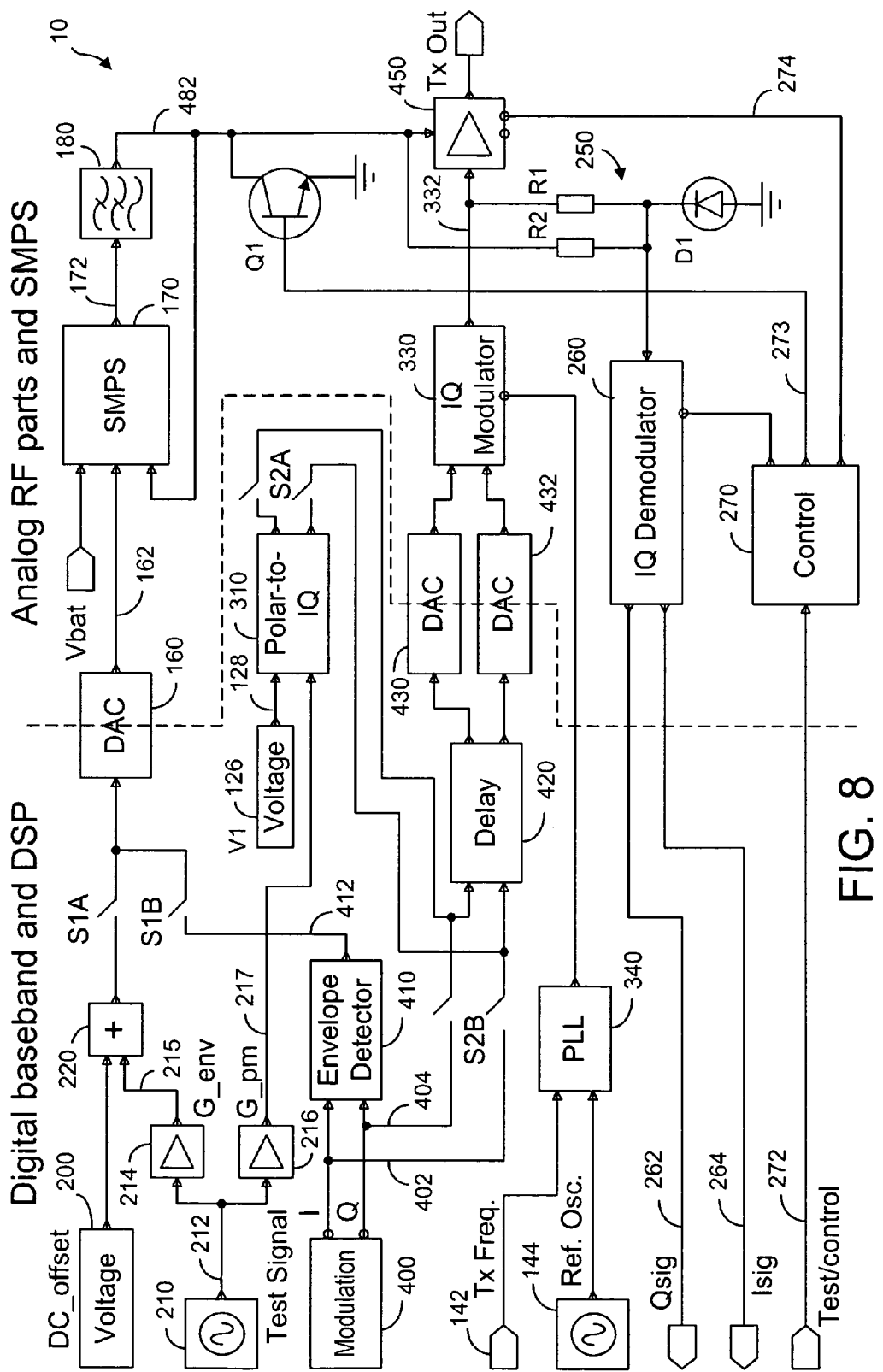
FIG. 8 is a simplified block diagram showing the system for propagation delay calibration in an envelope tracking transmitter, according to a different embodiment of the present invention.

As shown in FIG. 8, the delay calibration system, to some extent, is similar to the delay calibration system as shown in FIG. 4. The major differences between the front-end 10 as shown in FIG. 8 and the front-end 10 as shown in FIG. 4 are: 1) the I and Q baseband data 402, 404 as modulated by the modulation module 400 are directly conveyed to the IQ modulator 320 in the RF path. The I and Q baseband data 402, 404 are both delayed by a delay block 420 and converted from digital signals to analog signals by two separated digital-to-analog converters 430, 432; and 2) an envelope detector 410 is used to detect the envelope of the RF signal and the envelope signal 412 is conveyed to the envelope path containing the digital-to-analog converter 160, SMPS 170 and LPF 180. As such, the test signal 217 for the RF path must be first converted by a polar-to-IQ converter 310.

In the normal modulation mode, switch S1B is closed (ON) so as to allow the envelope signal 412 to be fed forward to the envelope path, and switch S2B is closed so as to allow the normal modulated RF signal containing both amplitude and phase modulation components to be conveyed to the input of PA 450. At the same time, switches S1A and S2A are open (OFF) so as to keep the test signal from entering into the transceiver front end.

In the calibration mode, switches S1B and S2B are open (OFF) while switches S1A and S2A are closed (ON) so that test signals are separately applied to the envelope and the RF paths. Here phase modulation of the test signal is generated in the Polar-to-IQ converter 310 and passed to the delay block 420 through switch S2A. The calibration is the same as that described in conjunction with the polar transmitter as shown in FIG. 2.

It should be appreciated by a person skilled in art that the phase modulator 250 can be replaced by a voltage controlled phase modulator or a phase shifter in order to carry out the phase modulation function. Moreover, since only the I-signal 264 is monitored to find out the delay match, the receiver IQ-demodulator 260 is not necessary. The IQ-demodulator can be replaced by a mixer for downcoverting the RF signal to a baseband signal for peak-to-peak amplitude monitoring, for example. The local oscillator signal for the mixer can be obtained from the receiver synthesizer, for example.

Thus, although the invention has been described with respect to one or more embodiments thereof, it will be understood by those skilled in the art that the foregoing and various other changes, omissions and deviations in the form and detail thereof may be made without departing from the scope of this invention.

What is claimed is:

1. A method comprising:
    conveying a test signal to a radio-frequency path and an envelope path in a radio-frequency transmitter for obtaining a first further signal indicative of the test signal from an end of the radio-frequency path, and a second further signal indicative of the test signal from an end of the envelope path, the test signal having a periodic waveform, wherein the radio-frequency transmitter comprises a receiving end configured for receiving baseband data, the transmitter further configured for conveying a first signal and a second signal based on the received baseband data, wherein the first signal is conveyed in the radio-frequency path for obtaining a phase-modulated radio-frequency signal indicative of the first signal at the end of the radio-frequency path, and the second signal is conveyed in the envelope path for obtaining an envelope signal indicative of the second signal at the end of the envelope path, and wherein the phase-modulated radio frequency signal is provided to an input of a power amplifier for transmission, and the envelope signal is provided to a voltage supply of the power amplifier;
    obtaining a demodulated waveform signal having a peak-to-peak amplitude at least based on the first further signal; and
    adjusting a propagation delay in one of the radio-frequency path and the envelope path to minimize the peak-to-peak amplitude.

2. The method of claim 1, wherein the demodulated waveform signal is indicative of the first and further signal and the second further signal.

3. The method of claim 1, wherein the test signal has a triangular waveform.

4. The method of claim 1, wherein the demodulated waveform signal is an in-phase signal.

5. An apparatus comprising:
a switching module configured for connection in a radio-frequency transmitter, the radio-frequency transmitter comprising an envelope path, a radio-frequency path, and a receiving end for receiving baseband data, the transmitter configured for providing a first signal and a second signal based on the received baseband data, and wherein the first signal is conveyed to the radio frequency path for obtaining a phase modulated radio-frequency signal indicative of the first signal at an end of the radio-frequency path, and the second signal is conveyed to the envelope path for obtaining an envelope signal indicative of the second signal at an end of the envelope path, the phase modulated radio-frequency signal provided to an input of output amplifier for transmission, the envelope signal provided to a voltage supply of the output amplifier, wherein the switching module is located between the receiving end and the output amplifier;
a test signal generator for providing a first test signal and a second test signal to the switching module, the first and second test signals having a periodic waveform, the switching module operable in a first state and in a second state, such that
 when the switching module is operated in the first state, the first test signal is conveyed to the radio-frequency path for providing a first further signal indicative of the first test signal to the end of the radio-frequency path, and the second test signal is conveyed to the envelope path for providing a second further signal indicative of the second test signal to the end of the envelope path, and
 when the switching module is operated in the second state, the first test signal is disconnected from the radio-frequency path and the second signal is disconnected from the envelope path;
a phase modulator operatively connected to the end of the radio-frequency path and the end of the envelope path for obtaining the first and second further signals when the switching module is operated in the first state,
a demodulation module configured to provide a demodulated waveform signal having a peak-to-peak amplitude in response to at least the obtained first further signal; and
a delay module, disposed in one of the radio-frequency path and the envelope path, configured to minimize the peak-to-peak amplitude.

6. The apparatus of claim 5, wherein the demodulated waveform signal is provided based on the obtained first further signal and the obtained second further signal.

7. The apparatus of claim 5, wherein the phase modulator comprises a first current path and a second current path, the first current path having a first end connected to the end of the radio-frequency path and a second end connected to the demodulation module, the second current path having a first end connected to the end of the envelope path and a second end connected to second end of the first current path.

8. The apparatus of claim 7, wherein the first current path comprises a resistor between the first and second ends of the first current path, and the second current path comprises a resistor between the first and second ends of the second current path, and wherein the phase modulator further comprises a diode connected between the second end of the first current path and a grounding point.

9. apparatus of claim 5, wherein the output amplifier uses an average current through the voltage supply when the switching module is operated in the second state, and the output amplifier is disabled when the switching module is operated in the first state, the apparatus further comprising:
a current sink operatively connected to the end of the envelope path to sink therefrom a current substantially the same as said average current when the switching module is operated in the first state.

10. system apparatus of claim 5, wherein the output amplifier comprises a transistor in the last amplification stage and the transistor is controlled to act as an active load when the switching module is operated in the first state.

11. The apparatus of claim 5, wherein the delay module is disposed in the radio-frequency path between the switching module and the end of the path for receiving the first test signal when the switching module is operated in the first state, and the transmitter comprises:
an in-phase/quadrature to polar converter;
a modulation module, located at the receiving end, configured to provide the baseband data modulated by 8-phase shift keying to an in-phase/Quadrature to polar converter, the in-phase/quadrature to polar converter configured for providing the first and second signals to the radio-frequency path and the envelope path through the switching module when the switching module is operated in the second state;
a radio-frequency modulation module, disposed between the delay module and the end of the radio-frequency path, configured to provide the phase modulated radio frequency signal in response to the first signal when the switching module is operated in the second state, and for providing the first further signal in response to the first test signal when the switching module is operated in the first state.

12. The apparatus of claim 11, wherein the radio-frequency modulation module comprises:
a phase-modulation to frequency-modulation module operatively connected to the delay module for receiving the first signal and for providing frequency-modulation information based on the first signal; and
a synthesizer, operatively connected to the phase-modulation to frequency-modulation module, a reference oscillator and a transmit frequency source, for providing the phase modulated radio-frequency signal based on the frequency-modulation information and the transmit frequency from the transmit frequency source.

13. The apparatus of claim 5, wherein the delay module is disposed in the radio-frequency path between the switching module and the end of the radio-frequency path for receiving the first test signal when the switching module is operated in the first state, and the transmitter comprises:
an in-phase/quadrature to polar converter;
a modulation module, located at the receiving end for, configured to provide the baseband data modulated by 8-phase shift keying to an in-phase/quadrature to polar converter, the in-phase to polar converter configured for providing the first and second signals to the radio-frequency path and the envelope path through the switching module when the switching module is operated in the second state;
an in-phase/quadrature modulator having an input end and an output end, the output end operatively connected to the input of the output amplifier;
a polar to in-phase/quadrature converter disposed between the delay module and the in-phase/quadrature modulator, wherein the polar to in-phase/quadrature converter comprises an output end operatively connected to the input end of the in-phase/quadrature modulator; a first input end operatively connected to a voltage source; and a second input end operatively connected to the delay module for receiving a delayed first signal when the switching module is operated in the second state and for receiving a delayed first test signal when the switching module is operated in the first state.

14. The apparatus of claim 5, wherein the delay module is disposed in the radio-frequency path between the switching module and the end of the radio-frequency path for receiving the first test signal when the switching module is operated in the first state, and the transmitter comprises:

an envelope detector for obtaining the second signal from the baseband data;

a polar to in-phase/quadrature converter, disposed between the switching module and the test signal generator, the polar to in-phase/quadrature converter having an input end for receiving the first test signal and a direct-current voltage, and an output end for providing a converted signal indicative of the first test signal and the direct current voltage;

an in-phase/quadrature modulator disposed between the delay module and the end of the radio-frequency path, the in-phase/quadrature modulator having two input ends and an output end, the output end operatively connected to the input of the output amplifier, wherein the delay module has two input ends and two output ends, the output ends operatively connected to the two input ends of the in-phase/quadrature modulator, the input ends operatively connected to the switching modules for receiving the converted signal from the polar to in-phase/quadrature converter when the switching module is operated in the first state, and receiving the in-phase data part and the quadrature data part when the switching module is operated in the second state.

15. The apparatus of claim 5, wherein the radio-frequency transmitter is part of a radio-frequency front end and the radio-frequency front end further comprises a radio-frequency receiver comprising the demodulation module.

16. The apparatus of claim 5, wherein the demodulated waveform signal is an in-phase signal.

17. A transceiver front end comprising:

a transmitter configured to convert baseband data into radio-frequency signal for transmission, and a receiver configured to convert received radio-frequency signals into baseband signal, wherein the transmitter comprises:

a power amplifier having an input end, a voltage supply terminal and an output end, the output end connected to a transmit path for transmitting the radio-frequency signal;

a data receiving end configured to receive baseband data;

an envelope path connected to the voltage supply terminal of the power amplifier;

an RF path connected to the input end of the power amplifier such that a first signal and second signal indicative of the baseband data are separately conveyed, respectively, to the envelope path for obtaining a phase modulated radio-frequency signal indicative of the first signal at an end of the radio-frequency path, and to the envelope path so as to obtain an envelope signal indicative of the second signal at an end of the envelope path, the phase modulated radio-frequency signal provided to the input end of power amplifier, the envelope signal provided to the voltage supply terminal of the power amplifier;

a switching module disposed between the receiving end and the power amplifier;

a test signal generator configured to provide a first test signal and a second test signal to the switching module, the first and second test signals having a periodic waveform, the switching module operable in a first state and in a second state, such that when the switching module is operated in the first state, the first test signal is conveyed to the radio-frequency path for providing a first further signal indicative of the first test signal to the end of the radio-frequency path, and the second test signal is conveyed to the envelope path for providing a second further signal indicative of the second test signal to the end of the envelope path, and when the switching module is operated in the second state, the first test signal is disconnected from the RF path and the second signal is disconnected from the envelope path;

a phase modulator having an input end and an output end, the input end operatively connected to the end of the radio-frequency path and the end of the envelope path for obtaining the first and second further signals when the switching module is operated in the first state, the output end operatively connected to a demodulation module in the receiver, for providing a demodulated waveform signal having a peak-to-peak amplitude in response to the obtained first and second further signals; and a delay module, disposed in one of the radio-frequency path and the envelope path, configured to minimize the peak-to-peak amplitude.

18. The transceiver front-end of claim 17, wherein the demodulated waveform signal is an in-phase signal.

19. An apparatus, comprising:

means, for conveying a test signal to a radio-frequency path and an envelope path in a radio-frequency transmitter for obtaining a first further signal indicative of the test signal from an end of the radio-frequency path, and a second further signal indicative of the test signal from an end of the envelope path, the test signal having a periodic waveform, wherein the radio-frequency transmitter comprises a receiving end configured for receiving baseband data, the transmitter further configured for conveying a first signal and a second signal based on the received baseband data, wherein the first signal is conveyed in the radio-frequency path for obtaining a phase-modulated radio-frequency signal indicative of the first signal at the end of the radio-frequency path, and the second signal is conveyed in the envelope path for obtaining an envelope signal indicative of the second signal at the end of the envelope path, and wherein the phase-modulated radio frequency signal is provided to an input of a power amplifier for transmission, and the envelope signal is provided to a voltage supply of the power amplifier;

means for obtaining a demodulated waveform signal having a peak-to-peak amplitude at least based on the first further signal; and means for adjusting a propagation delay in one of the radio-frequency path and the envelope path for minimizing the peak-to-peak amplitude.

20. The apparatus of claim 19, wherein the demodulated waveform signal is indicative of the first and further signal and the second further signal.

* * * * *

UNITED STATES PATENT AND TRADEMARK OFFICE
CERTIFICATE OF CORRECTION

PATENT NO. : 7,522,676 B2  Page 1 of 1
APPLICATION NO. : 11/349555
DATED : April 21, 2009
INVENTOR(S) : Jorma Matero It is certified that error appears in the above-identified patent and that said Letters Patent is hereby corrected as shown below:

In column 7, line 65, claim 9, line 1, before "apparatus", --The-- should be inserted.

In column 8, line 7, claim 10, line 1, before "system", --The-- should be inserted.

Signed and Sealed this

Second Day of June, 2009

JOHN DOLL
*Acting Director of the United States Patent and Trademark Office*